United States Patent [19]

Dutcher

[11] Patent Number: 4,833,476
[45] Date of Patent: May 23, 1989

[54] ELECTROMAGNETIC FIELD MEASURING TECHNIQUE TO ASSESS SHIELDING EFFECTIVENESS

[75] Inventor: Clinton Dutcher, Thousand Oaks, Calif.

[73] Assignee: G & H Technology, Inc., Santa Monica, Calif.

[21] Appl. No.: 939,942

[22] Filed: Dec. 9, 1986

[51] Int. Cl.$^4$ .................. G01S 3/02; G01R 31/02; G01R 23/04; G01N 27/72
[52] U.S. Cl. .................................. 342/351; 343/703; 324/72.5; 324/95; 324/239
[58] Field of Search ................ 342/351, 383; 343/703, 343/851, 841, 842; 324/72.5, 158 P, 74, 95, 130, 164, 260, 58 R, 58 A, 338, 144, 239; 340/643, 551, 552; 333/230, 222

[56] References Cited

U.S. PATENT DOCUMENTS

| | | | |
|---|---|---|---|
| 4,277,744 | 7/1981 | Andone et al. | 324/72 |
| 4,278,933 | 7/1981 | Klopach et al. | 324/58.5 R |
| 4,281,284 | 7/1981 | Stutz et al. | 324/58 A |
| 4,631,473 | 12/1986 | Honda | 324/72.5 |

OTHER PUBLICATIONS

Deficis et al., New Probes for Electromagnetic Fields, Sep. 1978, pp. 568-572, Proc. of the 8th European Microwave Conf.

Primary Examiner—Theodore M. Blum
Assistant Examiner—Gregory C. Issing
Attorney, Agent, or Firm—George J. Netter

[57] ABSTRACT

A threat field sensor has a hollow metal enclosure with imperforate side walls except for a single aperture that is small as compared with the wavelength of interfering electromagnetic energy. A coaxial conductor is located in the enclosure cavity and has separate sets of leads interconnected to each conductor end. Electric signals induced in the coaxial conductor and present at the conductor ends by the external electromagnetic fields passing through the enclosure aperture are converted to two corresponding light signals. The light signals are transmitted to remotely located processing apparatus by an optical fiber link where the light signals are converted once again to electric signal counterparts. Summing and differencing these electric signals provides two final signals representative of the electric and magnetic field, respectively. The electric field being normal to the coaxial conductor is uniquely defined by one such measurement; however, since the magnetic field is parallel to the sensor coaxial conductor, two orthogonal measurements must be taken to resolve the magnetic field.

7 Claims, 1 Drawing Sheet

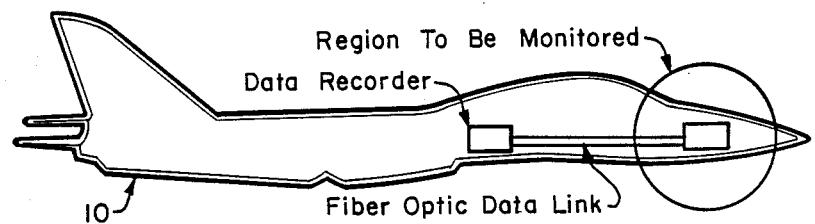
FIG. 1
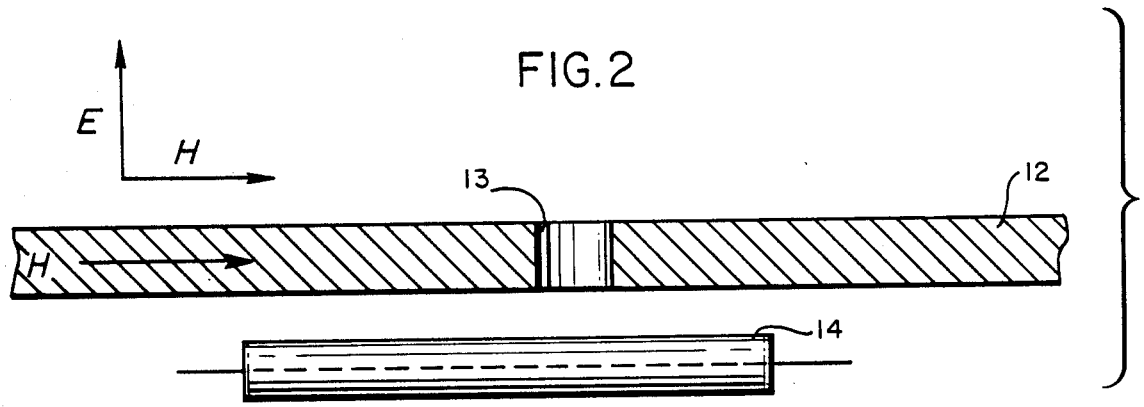
FIG. 2
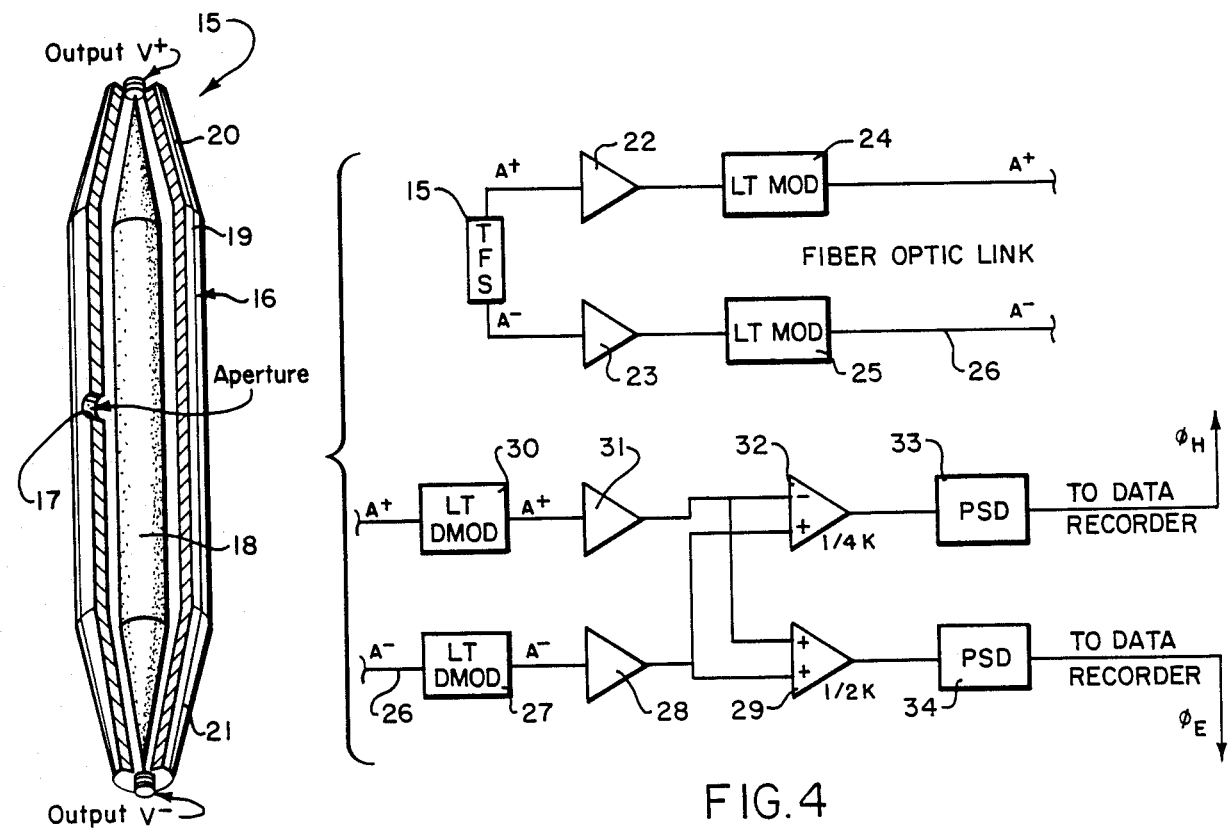
FIG. 3
FIG. 4

ELECTROMAGNETIC FIELD MEASURING TECHNIQUE TO ASSESS SHIELDING EFFECTIVENESS

The present invention relates generally to assessing electromagnetic field shielding effectiveness, and, more particularly, the assessment of shielding effectiveness by a technique of measuring specific electromagnetic field components in a region of interest contemplatd to include given shielded equipment.

BACKGROUND

A frequently encountered situation is that of considering the optimum placement of electronic equipment within a particular region of interest and to minimize the adverse affect of external interference electromagnetic fields. Also, a further consideration is the determination of what the associated shielding requirements should be in this same region for specified equipment.

If only radiation fields are present, then standard antenna measurements may be taken in order to map the field in the region of interest from which necessary information as to field strength, polarization and Poynting vector can be obtained. Although an antenna is not strictly speaking a "free field sensor" since it perturbs the field in the region of measurement, it perturbs the field in a way that enables determining what the field would be without the antenna present. Moreover, in purely radiation fields, the electric and magnetic vectors are uniquely related so that basic determinations can be made solely in terms of either the electric or the magnetic field, this typically being accomplished by electric field measurements. With this information in hand, theoretical assessment of the effect of placing any object (e.g., electronic equipment) in the region of interest is determinable since radiation fields imply a known boundary value condition at infinity.

The more usual and more difficult situation, however, is to effect measurements of reactive fields. To determine the reactive field prior to the placement of certain, say, electronics equipment in the region of interest, a satisfactory field sensor must be able (1) not to appreciably alter the field being measured and (2) the sensor must measure all six field components and their relative phases. By way of comparison, in a radiation field situation it can be safely assumed that the electronic equipment shall not have significant interaction with the electromagnetic field source whereas, however, this will not be true in the usual reactive field case. In either situation, the topology of neighboring metal or conductive boundaries must be taken into account.

As a practical example, modern day aircraft not only have electronic gear of great variety, but also are exposed to external interference electromagnetic fields which can possess relatively high intensities (e.g., radar). Moreover, since the external construction of the aircraft includes many metal features in complex arrangements, it is desirable and difficult to determine the best location for such gear from the standpoint of protecting the gear against electromagnetic field pollution. However, because complex metal topology of the reactive fields are exceedingly complex and not readily predictable, a means of measuring fields, both reactive and radiative, at any particular location quickly, easily and inexpensively would be highly advantageous.

SUMMARY OF THE INVENTION

Shields for electrical and electronic equipment are typically metal structures which enclose or are, in some way, interposed between an interference alternating electromagnetic field and the equipment which it is desired to isolate. To determine or assess the shielding effect at any particular location in accordance with the techniques described herein will entail the measurement of what is defined a "threat field" at a dielectric/metal interface in the region of interest. It will be shown that irrespective of whether the applied alternating field is radiative or reactive, the effect at a dielectric/metal interface is the production of an electric field which is normal to the interface and a magnetic field tangent to the interface. By determining the values of these latter two fields, which are collectively termed the "threat field", at the region of interest, will provide all the necessary information for assessing the shielding effect at that point independently of whether the fields are radiative or reactive, and which take into account adjacent metal topology.

The threat field sensor includes a hollow metal enclosure having imperforate side walls except for a single aperture that is small as compared with the wavelength of interfering electromagnetic energy. A coaxial conductor is located in the enclosure cavity and has separate sets of leads interconnected with each conductor end. The electric signals induced in the coaxial conductor and present at end conductor and by the external electromagnetic fields passing through the enclosure aperture are converted to two corresponding light signals. The light signals are transmitted to remotely located processing apparatus by an optical fiber link where the light signals are converted once again to electric signal counterparts, and summing and differencing these electric signals to provide two final signals representative of the electric and magnetic field respectively. The electric field being normal to the coaxial conductor is uniquely defined by one such measurement; however, since the magnetic field is parallel to the sensor coaxial conductor, two orthogonal measurements must be taken to resolve the magnetic field.

DESCRIPTION OF THE DRAWINGS

FIG. 1 depicts a schematic view of an aircraft in connection with which it is desired to assess electromagnetic conditions or to determine shielding effectiveness.

FIG. 2 is a sectional view of a shielding plate with a schematic representation of the field vectors of an interference electromagnetic field.

FIG. 3 is a perspective, partially sectional view of a threat field sensor.

FIG. 4 is a function block schematic of signal processing circuit apparatus.

DESCRIPTION OF A PREFERRED EMBODIMENT

With reference now to the drawings, and particularly FIG. 1, there is depicted an aircraft 10 on which it is desired to locate certain electronic equipment and, in accordance with the techniques of the invention to be described, the various regions of the aircraft will be examined to assess and obtain the preferred location for the equipment in order to assess the shielding requirements for isolating the equipment from external electromagnetic fields. Typically, an aircraft includes a large number of external and internal metal structures that will vary in location and arrangement for each aircraft and which can cause substantial local field variations. Still further, substantial electromagnetic interference fields of great variety and strength are to be found by an aircraft in normal usage (e.g., radar). Although the application of the invention will be described particularly in connection with location and assessment of compartments and the like on an aircraft, the described techniques and apparatus will be equally applicable for assessing regions on board a ship, exterior and interior of vehicles, buildings or open air locations wherever significant interference electromagnetic fields are expected.

In approaching the problem of assessing the electromagnetic environment for a given region, a first and primary consideration is the determination of what kind of electromagnetic fields are expected in this region against which shielding is to be provided. If the anticipated fields are solely radiative, then standard antenna measurements can be utilized to map the fields, obtaining desired information such as field strength, polarization, and Poynting vector. Moreover, since for radiation fields the electric and magnetic vectors are uniquely related, this simplifies the matter to primarily a mapping of either the electric or magnetic field, but not both, with the electric field usually chosen because of convenience in measurement. With the information obtained, the predicted effect of locating equipment in the region of interest can then be theoretically determined since radiation fields imply a known boundary condition at infinity. It can also be assumed for radiative fields that the equipment to be located in the region of interest will not interact significantly with the field sources.

The situation is altered considerably when we consider reactive electromagnetic fields. To be able to determine accurately the fields prior to location of the, say, electronic equipment in the region of interest, we need a field sensor that first of all will not appreciably alter the field by its presence and, secondly, will be able to measure all six field components (i.e., x, y and z components for the E field and the same, for the H field) and their phases relative to one another. Still further, when considering detection and measurement of reactive fields, the presence of the sensor may have a significant interaction with the reactive field source. Primarily because of the latter, the topology of neighboring metallic boundaries and the effect of placing additional equipment in the area must be taken into account or the accuracy of field determination can be substantially impaired.

It is therefore fundamental to the present invention to define an alternative field associated with the region of interest in which measurements are to be taken which is independent of the fact that the electromagnetic fields present in the region of interest are either radiative or reactive, that this alternative field takes into account the neighboring metallic boundaries and therefore will closely define the effectiveness of any shielding that is adopted. The term which will be used herein for this alternative field is a "the shield threat field".

Since a shield or shielding structure to isolate or prevent penetration by an electromagnetic field is, in the usual case, a metallic structure or housing, it is instructive to examine initially the electromagnetic interaction at such a shielding dielectric/metal boundary shown in FIG. 2 as a metal plate 12 located in air. As a direct consequence of application of the Maxwell equations, electromagnetic boundary conditions can be shown to be represented by the following mathematical equations:

$$\eta \cdot (\epsilon_1 E_1 - \epsilon_2 E_2) = 4\pi\rho, \eta \times [E_1 - E_2] = 0$$

$$\eta \cdot (\mu_1 H_1 - \mu_2 H_2) = 0, \eta \times (H_1 - H_2) = \frac{4\pi}{c} \kappa$$

Where,
$E_1$, $E_2$ = electrical field vectors outside and inside the metal;
$H_1$, $H_2$ = magnetic field vectors outside and inside metal;
$\eta$ = unit vector, vertically outward of metal;
$\rho$ = surface charge density; and
$\kappa$ = surface current density;

At a dielectric/metal interface (e.g. air-to-metal) experience has shown that $E_2 << E_1$ and $H_2 << H_1$ from which it follows that to a practical approximation, $$\eta \cdot E_1 = \frac{4\pi\rho}{\epsilon_1} \eta \times E_1 = 0 \quad (1)$$

$$\eta \cdot H_1 = 0 \; \eta \times H_1 = \frac{4\pi}{c} \kappa \quad (2)$$

Equations (1) state that at the dielectric/metal interface the electric field vector is entirely normal to the metal surface and equations (2) bring out that the magnetic field is tangential to the surface. This situation results whatever the nature of the applied field, be it radiative or reactive. It is these fields closely adjacent the metal surface that are termed herein the shield threat fields, the determination of which provides a ready means of measuring shielding effectiveness.

There are only two coupling mechanism which have to be considered for penetration of a metallic shield by an electromagnetic field, namely, (1) direct diffusion through the metal and (2) through one or more apertures which may exist in the metal. At higher frequencies, the most damaging and, therefore, the most important for our purposes, is penetration which is effected via aperture.

The aperture, which may take many shapes in practice, is shown generally in FIG. 2 as a circular opening 13 which extends completely though the shield plate 12, and it is to be understood that the cross-section of the opening must be small in comparison to the overall dimensions of the plate and small in comparison to a wave length at the frequency of operation of the fields under consideration. It can be shown, although it is believed beyond requirements for present purposes to set forth detailed derivation of this, that closely adjacent to the aperture, a large number of normal modes, including those beyond cutoff, may be required to represent the aperture field. However, a short distance away from the aperture only those modes above cutoff will make a significant contribution. Therefore, it is fundamental to this invention only to consider the projection of the aperture on the propagating modes to assess the effect of this aperture on the inner conductor of a transmission line identified schematically at 14. It can be shown that the E and H field quantities (i.e., electric and magnetic fields) immediately adjacent the shield and in the region of a projection of the aperture have the following relationship:

$$E \cdot \rho = \frac{1}{2\kappa} [A^- + A^+] \quad (3)$$

$$H \cdot \phi = \frac{1}{2\kappa} [A^- - A^+] \quad (4)$$

From this it follows that summation of induced waves from both ends of the coaxial line provides the desired shield threat field. Although we have used a coaxial line and the TEM mode in the immediately preceding discussion, similar results can be obtained for higher order modes and also when other types of transmission lines are used (e.g., a wave guide).

It is also clear that the expressions obtained are scalar products with respect to both normal and tangential components of the transmission line. In sensing the E field, orientation of the sensor is not important since the E field is always normal to the shield. However, although the H field is parallel to the conductor surface, it can take any angular orientation, and, therefore, it would be necessary to orient the sensor according to the maximum magnetic field strength or, alternatively, to take two orthogonal measurements.

Turning now to FIG. 3, threat field sensing apparatus in accordance with the practice of the present invention is enumerated generally as 15. In its major parts the threat field sensing apparatus includes a metal housing 16 having a single circular aperture 17 in a side wall and a coaxial conductor 18 within the housing. The housing 16 includes a central generally cylindrical part 19 having its end opening contained by first and second hollow cones 20 and 21. The coaxial conductor 18 is fixedly mounted within the housing closely spaced from and directly opposite the aperture 17.

With reference now to FIG. 4 and the circuit apparatus for processing the signals obtained from sensor 15, each end of the coaxial conductor is interconnected via amplifiers 22 and 23 with separate means 24 and 25 for producing modulated light signals of varying intensity proportional to the magnitude and phase of electric signals existing in the coaxial conductor respective ends. The light output of means 24 is identified as A+ and that of means 25 as A−, indicating generally the phase difference that exists between induced electric signals at the two ends of the coaxial conductor 18.

The A− light signal passes along optical fiber 26 to a light demodulator 27 where it is converted to an equivalent electric signal. After buffering in amplifier 28 it is fed into one terminal of a summation amplifier 29.

Similarly, the light signal A' is converted to an electric signal at demodulator 30, buffered in an amplifier 31 and fed into the amplifier 29 to provide an output signal corresponding to $(k/2)(A^+ + A^-)$. The buffered signals are also entered into a difference amplifier 32 forming an output $(k/2)(A^- - A^+)$. The absolute values of the sum and difference signals are rendered in 33 and 34 after which they are recorded. The recorded values correspond respectively to the electric and magnetic fields at the aperture 17 which is referred to herein as the shield threat field.

In use of the described apparatus, the threat field sensing equipment is moved from place to place in a region of interest recording the threat field at each place. Having "mapped" the region, a location may be chosen for installation of, say, electronic equipment with full assurance and knowledge of the location characteristics with respect to ambient electromagnetic fields.

As described, the threat field sensor signals are converted to corresponding light signals by light modulation means 24 and 25 located externally of the sensor housing 16. It is considered within the spirit of the invention, however, to locate the amplifiers 22, 23 and light modulation means 24, 25 within the housing so that the possibility of inadvertent electromagnetic contamination is reduced even further.

Having determined what the threat-field is in the region of interest, it may be advisable to subject the shielded equipment on a test basis to the same level of threat-fields to see if it becomes damaged. Such testing is done in a shielded room (i.e., resonant cavity) using antennas as the electromagnetic energy excitation source. The equipment package is located in the shielded room and a threat-field sensor as described here is located closely adjacent. Electromagnetic field energy is then applied until that amount of threat-field is applied to the equipment which had been found in the region of interest. In this way, the test conforms rather precisely to expected actual field conditions.

The invention has been described in connection with a preferred embodiment; however, it will be apparent to those skilled in the appertaining art that various changes and modifications may be made and still be within the contemplation of the invention.

I claim:

1. Apparatus for determining radiative and reactive magnetic and electric fields in a given region, comprising:
    a shielded enclosure having an aperture which aperture is to be located in said given region;
    a coaxial conductor mounted within the enclosure adjacent the aperture;
    first and second light modulating means interconnected with the respective ends of the coaxial conductor for producing first and second light signals corresponding to the electric voltages induced at the coaxial conductor ends by the electric and magnetic fields;
    remotely located circuit means responsive to light signals for producing electric sum and difference signals corresponding respectively to the electric and magnetic fields at the enclosure aperture; and
    an optical fiber link interconnecting the light modulating means and the remotely located circuit means.

2. A method of assessing electromagnetic field shielding effectiveness in a region of interest, comprising the steps of:
    locating an apertured shield so that one surface only of the shield is exposed to the region of interest;
    positioning a coaxial conductor closely adjacent the shield aperture on a further surface of the shield not exposed to the region of interest except through the aperture; and
    summing and differencing electric signals existing at the two ends of the coaxial conductor as a result of electromagnetic field induction through the aperture by fields existing in the region of interest to provide signals representative of the electric field and magnetic field, respectively, at the apertured shield.

3. A method as in claim 2, including the further step of orthogonally repositioning the coaxial conductor and performing the summing and differencing step again.

4. Apparatus for measurement of the electromagnetic field at a given point, comprising:
- a shielded housing having a single opening therein;
- a coaxial conductor mounted within the housing closely adjacent and directly opposite the housing opening; and
- means interconnecting the two ends of the coaxial conductor for providing a first signal corresponding to the sum of electric voltages appearing at the conductor ends and a second signal corresponding to the difference of said voltages, which voltages are induced in the coaxial conductor by the electromagnetic field acting through the housing opening.

5. Apparatus as in claim 4, in which said means for providing first and second signals includes means for converting the induced electric voltages in the coaxial conductor into corresponding first and second light signals, first and second means responsive to the respective first and second light signals for providing further corresponding electric signals, sum and difference means fed by the further corresponding electric signals to provide a pair of output signals corresponding respectively to the sum and difference thereof.

6. Apparatus as in claim 5, in which recording means are interconnected to receive the output signals and record the same.

7. Apparatus as in claim 4, in which the housing is generally cylindrical with an aperture formed in the side wall, and the coaxial conductor has its two ends secured in the respective housing ends with the conductor extending generally parallel to the housing cylindrical axis.

* * * * *